(12) United States Patent
Aiso (10) Patent No.: US 8,705,296 B2
(45) Date of Patent: Apr. 22, 2014

(54) MEMORY CONTROLLER AND CONTROL METHOD

(75) Inventor: Shinya Aiso, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 81 days.

(21) Appl. No.: 13/454,200

(22) Filed: Apr. 24, 2012

(65) Prior Publication Data

US 2012/0307575 A1 Dec. 6, 2012

(30) Foreign Application Priority Data

Jun. 3, 2011 (JP) ................................ 2011-124767

(51) Int. Cl.
*G11C 7/00* (2006.01)

(52) U.S. Cl.
USPC ...................................... 365/189.15; 365/201

(58) Field of Classification Search
USPC ............................................. 365/189.15, 201
See application file for complete search history.

(56) References Cited

U.S. PATENT DOCUMENTS

| | | | | |
|---|---|---|---|---|
| 6,075,393 A | * | 6/2000 | Tomita et al. ................. | 327/153 |
| 6,148,424 A | * | 11/2000 | Tsutsui .......................... | 714/720 |
| 7,158,433 B2 | * | 1/2007 | Riho et al. .................... | 365/222 |
| 7,363,558 B2 | * | 4/2008 | Fukuyama .................... | 714/724 |
| 7,697,355 B2 | * | 4/2010 | Kobayashi .................... | 365/201 |
| 7,924,950 B2 | * | 4/2011 | Chen et al. .................... | 375/341 |
| 7,957,210 B2 | | 6/2011 | Yamazaki | |
| 8,286,045 B2 | * | 10/2012 | Yasui ............................ | 714/738 |
| 2009/0129179 A1 | | 5/2009 | Yamazaki | |

FOREIGN PATENT DOCUMENTS

JP 2009-130455 6/2009

* cited by examiner

*Primary Examiner* — Michael Tran (74) *Attorney, Agent, or Firm* — Staas & Halsey LLP (57) ABSTRACT

A memory controller includes: a first write circuit configured to write a first dummy pattern including a plurality of consecutive first dummy values at a first address of a memory; a second write circuit configured to write a first pattern including a plurality of types of consecutive values at a second address of the memory after a write operation of the first dummy pattern by the first write circuit; a third write circuit configured to write a second dummy pattern including a plurality of consecutive second dummy values at a third address of the memory after a write operation of the first pattern by the second write circuit; a read circuit configured to read the written first pattern based on the second address of the memory; and a timing adjustment circuit configured to adjust a timing at which data is written into the memory based on a read first pattern.

11 Claims, 9 Drawing Sheets

FIG. 1A CLK@DIMM

FIG. 1B DQS

FIG. 1C RESPONSE FROM DIMM

FIG. 1D DQS

FIG. 1E RESPONSE FROM DIMM

MEMORY CONTROLLER AND CONTROL METHOD

CROSS-REFERENCE TO RELATED APPLICATION(S)

This application is based upon and claims the benefit of priority of the prior Japanese Patent Application No. 2011-124767, filed on Jun. 3, 2011, the entire contents of which are incorporated herein by reference.

FIELD

The embodiments discussed herein are related to a memory controller and a control method.

BACKGROUND

A Dual Inline Memory Module (DIMM) uses a Double Data Rate 3 (DDR3)-Synchronous DRAM (SDRAM).

A related art is disclosed in Japanese Laid-open Patent Publication No. 2009-130455 or the like.

SUMMARY

According to one aspect of the embodiments, a memory controller includes: a first write circuit configured to write a first dummy pattern including a plurality of consecutive first dummy values at a first address of a memory; a second write circuit configured to write a first pattern including a plurality of types of consecutive values at a second address of the memory after a write operation of the first dummy pattern by the first write circuit; a third write circuit configured to write a second dummy pattern including a plurality of consecutive second dummy values at a third address of the memory after a write operation of the first pattern by the second write circuit; a read circuit configured to read the written first pattern based on the second address of the memory; and a timing adjustment circuit configured to adjust a timing at which data is written into the memory based on a read first pattern.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a DIMM, owing to Write Leveling, an edge of a clock (hereinafter, referred to as a CLK) and an edge of a data strobe signal (hereinafter, referred to as a DQS) are set so as to occur within a predetermined time in a write operation at a DRAM end.

Figure 1A:
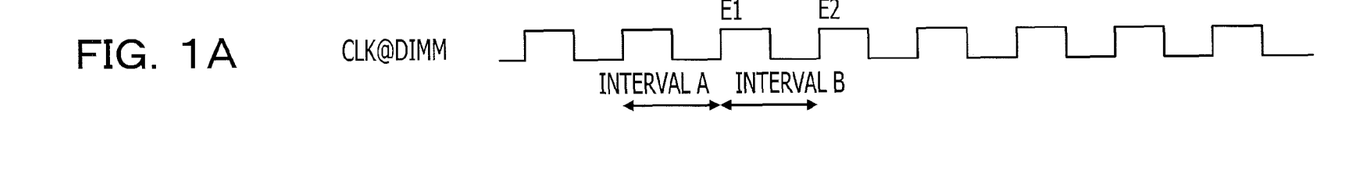
FIG. 1A to FIG. 1E illustrate an exemplary sequence of Write Leveling.
Figure 1B:
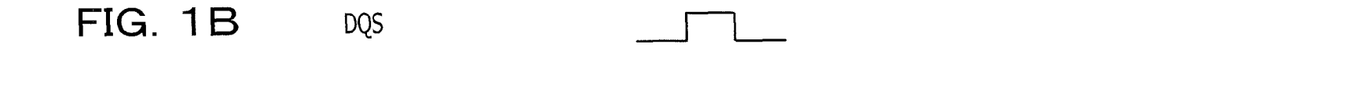
Figure 1C:
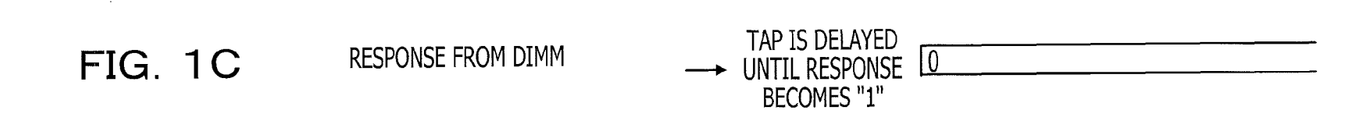
Figure 1D:
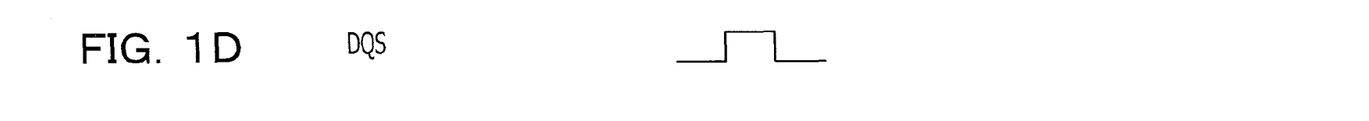
Figure 1E:
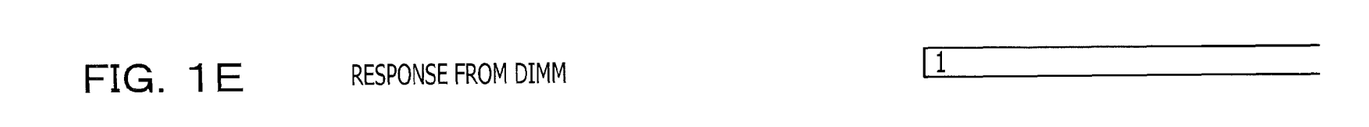

The Write Leveling adjusts or corrects the DQS so that the DQS is input substantially concurrently with the CLK. FIG. 1A to FIG. 1E illustrate an exemplary sequence of Write Leveling. FIG. 1A illustrates the CLK of the DIMM. FIG. 1B and FIG. 1D illustrate the DQSs. FIG. 1C and FIG. 1E illustrate responses from the DIMM.

In the Write Leveling, as illustrated in FIG. 1B and FIG. 1D, the output timing of the DQS from a controller is delayed. It is determined whether or not the output timing of the DQS coincides with the edge of the CLK based on the responses from the DIMM illustrated in FIG. 1C and FIG. 1E. For example, when the response from the DIMM is "0" as illustrated in FIG. 1C, the output timing of the DQS from the controller is delayed until the response from the DIMM becomes "1" as illustrated in FIG. 1E.

In the Write Leveling, it is determined whether or not the edge of the DQS coincides with the edge of the CLK. For example, as illustrated in FIG. 1A, when the DQS starts from an interval A, it is determined the DQS coincides with an edge E1. When the DQS starts from an interval B, it is determined the DQS coincides with an edge E2. By a certification tool, it may be determined whether or not the edge is adequate.

Owing to the initial value of a delay TAP at the start of the Write Leveling, based on the design value of a line length or the like, the misalignment of cycles with respect to a target edge in the Write Leveling may be reduced. For example, when the edge E2 illustrated in FIG. 1A is the target edge, the initial value of the delay TAP where the DQS starts from the interval B may be set based on the design value of a line length or the like.

The gate training of a DDR PHY Interface (DFI) that is the general-purpose interface of the Double Data Rate (DDR) may be used. Based on a time period in which the DQS at the time of reading, subjected to training, is available, the misalignment of writing may be corrected from a state in which the timing of reading is adjusted. Data subjected to writing/reading may be compared with data at a read timing.

Figure 2:
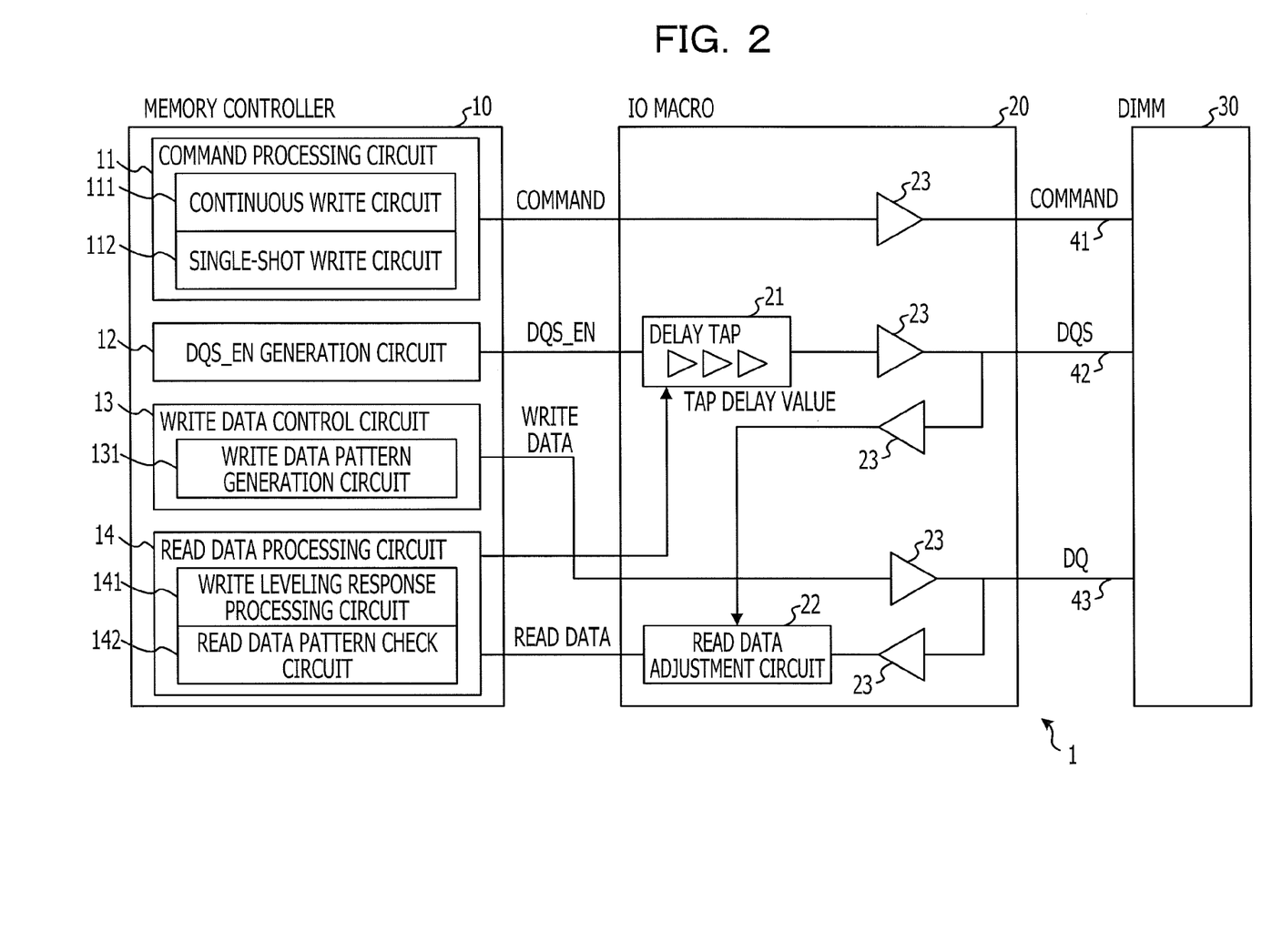
FIG. 2 illustrates an exemplary memory system.

FIG. 2 illustrates an exemplary memory system.

For example, a memory system 1 is included in an information processing device including a central processing unit (CPU). As illustrated in FIG. 1, the memory system 1 includes a memory controller 10, an IO macro 20, and a DIMM 30. The DIMM 30 may be a memory module including a plurality of DRAM chips, and for example, may be used as the main storage of the information processing device. The DIMM 30 is coupled to the IO macro 20 through a command signal line 41, a DQS signal line 42, a DQ (data) signal line 43, and a clock signal line or the like not illustrated. The DIMM 30 may include a DDR3-SDRAM.

When having received a write command from the memory controller 10, the DIMM 30 retrieves a data signal in synchronization with the rising and falling edges of the DQS. Data output from the DQ is written at an address specified by the write command. While a /DQS signal corresponding to the inverted signal of a DQS signal is output, as a data strobe signal, from a /DQS terminal, the diagrammatic representation may be omitted in the figure. The configuration or function of the DIMM 30 may be an existing configuration or function.

The IO macro 20 between the memory controller 10 and the DIMM 30 adjusts the waveform and the timing of an analog signal. The IO macro 20 illustrated in FIG. 2 includes a delay TAP 21, a read data adjustment circuit 22, and a plurality of drivers 23. The delay TAP 21 delays a DQS_EN (DQS_enable) signal output from a DQS_EN generation circuit 12 in the memory controller 10. For example, in the delay TAP 21, taps not illustrated, each of which assigns a unit delay time, may be multistage-coupled in series. In response to a TAP delay value input from a read data processing circuit 14, a path through which a signal passes is switched, thereby assigning a delay according to the TAP delay value. After being delayed in response to the TAP delay value, the DQS_EN signal input into the delay TAP 21 is supplied, as the DQS signal, to the DIMM 30 through the DQS signal line 42. The configuration or function of the delay TAP 21 may be an existing configuration or function.

The read data adjustment circuit 22 supplies the DQ read from the DIMM 30 to the memory controller 10, as read data, with the timing-adjusted DQS accompanying the DQ. The driver 23 on each signal line in the IO macro 20 performs the waveform adjustment of a signal, or the like. The memory controller 10 controls writing and reading data into and from the DIMM 30. The memory controller 10 illustrated in FIG. 2 includes a command processing circuit 11, a DQS_EN generation circuit 12, a write data control circuit 13, and a read data processing circuit 14.

In response to control from the command processing circuit 11, the DQS_EN generation circuit 12 generates and outputs the DQS_EN signal to be the base of the DQS. After having been input into the IO macro 20, the DQS_EN signal output from the DQS_EN generation circuit 12 is supplied, as the DQS, to the DIMM 30. The write data control circuit 13 generates a write data pattern to be written into the DIMM 30 so as to detect the misalignment of cycles in the Write Leveling. For example, the write data control circuit 13 may generate adjustment data DT1 and dummy data DT2, and dummy data DT3, as the write data pattern.

FIG. 3A to FIG. 3D illustrate an exemplary write data pattern. FIG. 3A, FIG. 3B, FIG. 3C, and FIG. 3D illustrate the dummy data DT2, the adjustment data DT1, the dummy data DT3, and adjustment data DT4, respectively. The adjustment data (test pattern) DT1. illustrated in FIG. 3B may include a data sequence including a plurality of types of test values, for example, eight types of test values D1 to D8, for example, an 8-bit data sequence. The test values D1 to D8 included in the adjustment data DT1 may be values different from one another, and "1" to "8" may be used as the test values D1 to D8.

Figure 3A:
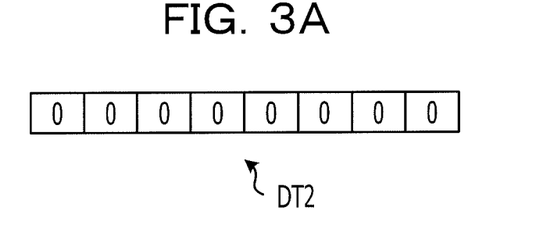
FIG. 3A to FIG. 3D illustrate an exemplary write data pattern.
Figure 3B:
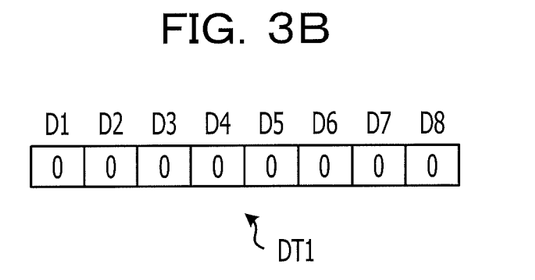
Figure 3C:
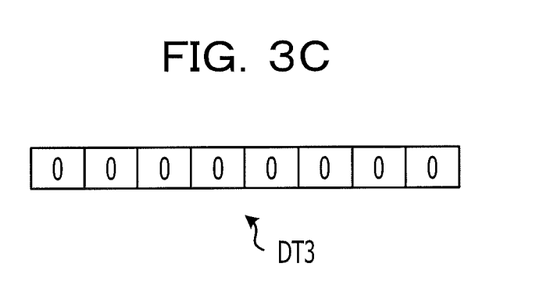
Figure 3D:
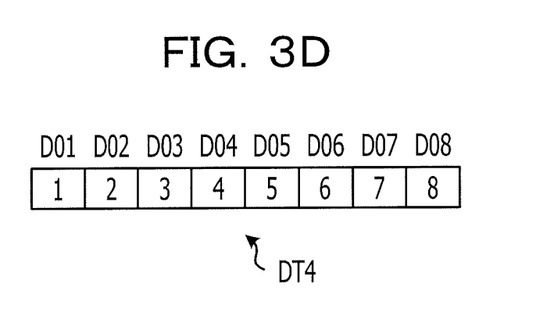

The dummy data (first dummy pattern) DT2 illustrated in FIG. 3A may include the data sequence of the same value preliminarily set, for example, the data sequence of a dummy value. For example, "0" may be used as the dummy value. The dummy data (second dummy pattern) DT3 illustrated in FIG. 3C may include the data sequence of the same set value, for example, the data sequence of a dummy value. "0" may be used as the dummy value. The numbers of bits of the dummy data DT2 and dummy data DT3 may be the same as the number of bits of the adjustment data DT1.

The adjustment data DT1, the dummy data DT2, and the dummy data DT3 may be used in a continuous write function 111 in the command processing circuit 11. The adjustment data DT4 illustrated in FIG. 3D may include a data sequence including a plurality of types of test values, for example, eight types of test values D01 to D08, for example, an 8-bit data sequence. The test values D01 to D08 included in the adjustment data DT4 may be values different from one another. "1" to "8" may be used as the test values D01 to D08.

The individual test values D01 to D08 included in the adjustment data DT4 may be equal to the test values D1 to D8 of the adjustment data DT1 or may be different from the test values D1 to D8 of the adjustment data DT1. In a write data pattern, each of the test values D1 to D8, each of the test values D01 to D08, or each of the dummy values may correspond to 1 burst address.

A write data pattern generation circuit 131 within the write data control circuit 13 generates the adjustment data DT1, the dummy data DT2, and the dummy data DT3. In response to the generation request of a write data pattern from the command processing circuit 11, the write data pattern generation circuit 131 generates the adjustment data DT1, the dummy data DT2, and the dummy data DT3.

The dummy values of the dummy data DT2 and the dummy data DT3 may be "0" or may not be "0". For example, a value other than "0" may be used, and the dummy value of the dummy data DT2 and the dummy value of the dummy data DT3 may be different from each other. These dummy values may be different from the test values D1 to D8 of the adjustment data DT1 or the test values D01 to D08 of the adjustment data DT4.

The command processing circuit 11 transmits, to the DIMM 30, a command, for example, a write command or read command for data. Issuing the command to the DIMM 30 may be performed after the issue of an active command specifying a row, for example. For example, in addition to specifying the address (ADRS) of an access destination, the write command [CAS(Write)] or the read command [CAS (Read)] of a CAS (Column Address Strobe) may be transmitted.

As for the timing adjustment of the Write Leveling, the command processing circuit 11 illustrated in FIG. 2 includes a continuous write circuit 111 and a single-shot write circuit 112. A mode, in which the continuous write circuit 111 writes a write data pattern into the DIMM 30, may be referred to as a continuous write mode, and a mode, in which the single-shot write circuit 112 writes a write data pattern into the DIMM 30, may be referred to as a single-shot write mode.

In the memory system 1, the continuous write mode and the single-shot write mode are selectively set. In the timing adjustment of the Write Leveling, the continuous write circuit 111 continuously writes the dummy data DT2, the adjustment data DT1, and the dummy data DT3 into the DIMM 30, as the write data pattern.

Figure 4A:
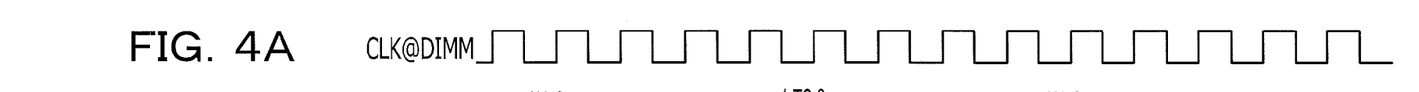
FIG. 4A to FIG. 4H illustrate an exemplary write process.
Figure 4B:
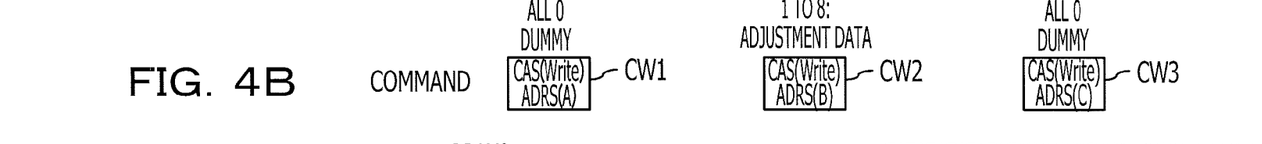
Figure 4C:
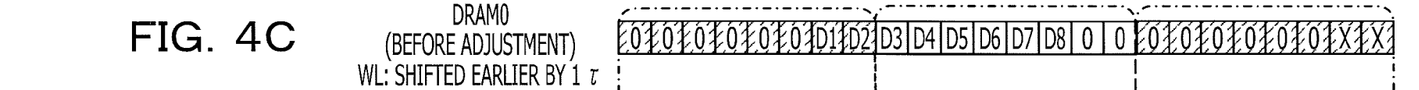
Figure 4D:
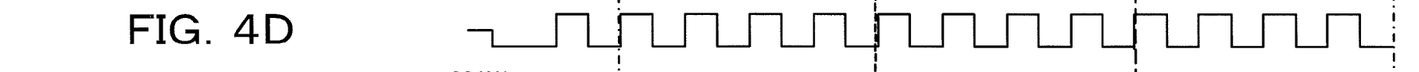
Figure 4E:
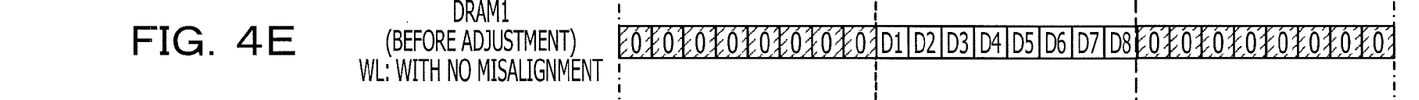
Figure 4F:
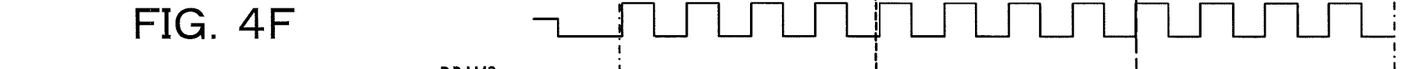
Figure 4G:
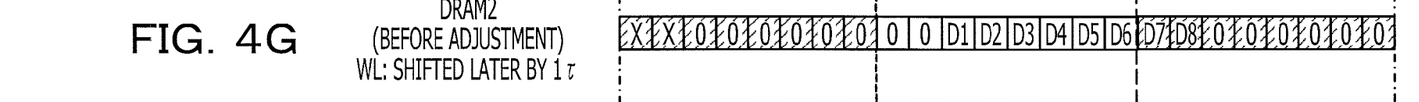
Figure 4H:
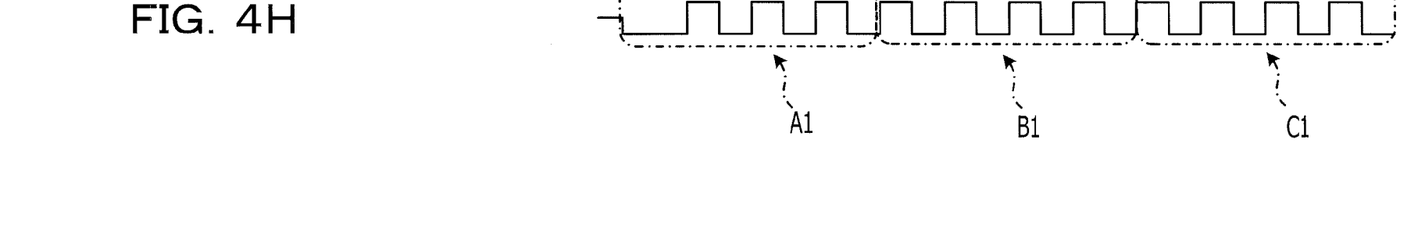

For example, the continuous write mode may be set at the time of the factory shipment of the information processing device, at the time of the initial setting thereof, or at the time of the power activation thereof. FIG. 4A to FIG. 4H illustrate an exemplary write process. For example, the write process illustrated in FIGS. 4A to 4H may be the write process in the continuous write mode in the memory system 1 illustrated in FIG. 2. FIG. 4A illustrates the CLK (CLK@DIMM) of the DIMM 30. Each of FIG. 4D, FIG. 4F, and FIG. 4H illustrates the DQS of the DIMM 30. FIG. 4B illustrates a write command transmitted from the command processing circuit 11. Each of FIG. 4C, FIG. 4E, and FIG. 4G illustrates a write data pattern written into the DIMM 30.

An arrow A1 illustrated in FIG. 4A to FIG. 4H indicates data to be stored at a first address A. An arrow B1 illustrated in FIG. 4A to FIG. 4H indicates data to be stored at a second address B. An arrow C1 illustrated in FIG. 4A to FIG. 4H indicates data to be stored at a third address C. In FIG. 4E and FIG. 4F, the DQS in the Write Leveling (WL) may correspond to a preferable timing, and the write data pattern is written into the DIMM 30 without the misalignment thereof. For example, the test values D1 to D8 of the adjustment data DT1 is stored at the second address B without being missing.

In FIG. 4C and FIG. 4D, the timing of the DQS in the Write Leveling becomes earlier than states illustrated in FIG. 4E and FIG. 4F, and the write data pattern is stored in a state in which the write data pattern is shifted to a preceding side by an amount of one cycle (1 τ). For example, in FIG. 4C and FIG. 4D, the test values D1 and D2 are stored within the first address A without being stored within the second address B. The test values D3 to D8 of the adjustment data DT1 are stored at the second address B, and two dummy values "0" are stored at the second address B, subsequent to the test value D8. In FIG. 4C and FIG. 4D, two indefinite values X are stored at the third address C, subsequent to six dummy values "0".

In FIG. 4G and FIG. 4H, the timing of the DQS in the Write Leveling becomes later than states illustrated in FIG. 4E and FIG. 4F, and the write data pattern is stored in a state in which the write data pattern is shifted to a following side by 1 τ. For example, in FIG. 4G and FIG. 4H, the test values D7 and D8 are stored within the third address C without being stored within the second address B. At the second address B, the test values D1 to D6 of the adjustment data DT1 are stored and two dummy values "0" are stored prior to the test value D1. In FIG. 4G and FIG. 4H, two indefinite values X are stored at the first address A, prior to six dummy values "0".

As illustrated in FIG. 4B, in the continuous write circuit 111, the dummy data DT2, the adjustment data DT1, and the dummy data DT3 are sequentially written based on three commands CW1, CW2, and CW3 successively transmitted from the command processing circuit 11 to the DIMM 30. The command CW1 may be a write command for writing the dummy data DT2 at the first address A of the DIMM 30. The command CW2 may be a write command for writing the adjustment data DT1 at the second address B of the DIMM 30. The command CW3 may be a write command for writing the dummy data DT3 at the third address C of the DIMM 30.

The addresses A, B, and C may be preliminarily set or the command processing circuit 11 may arbitrarily set the addresses A, B, and C. The addresses A, B, and C may be within a same row, or may be within a range from which the addresses A, B, and C are read by one memory access. The command processing circuit 11 requests the write data control unit 13 to generate the write data pattern (the adjustment data DT1, the dummy data DT2, and the dummy data DT3) to be transmitted along with the individual write commands CW1 to CW3.

In the continuous write mode, the command processing circuit 11 writes the dummy data DT2 at the first address A of the DIMM 30, and writes the adjustment data DT1 at the second address B of the DIMM 30 subsequent to the writing of the dummy data DT2. In the continuous write mode, the command processing circuit 11 writes the dummy data DT3 at the third address C of the DIMM 30 subsequent to the writing of the adjustment data DT1.

Figure 5A:
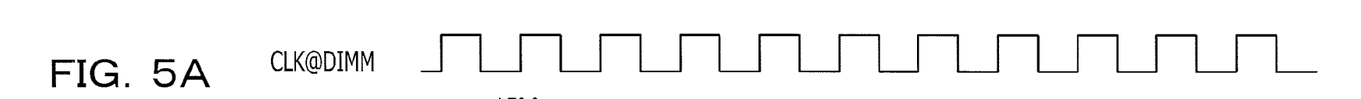
FIG. 5A to FIG. 5H illustrate an exemplary write process.
Figure 5B:
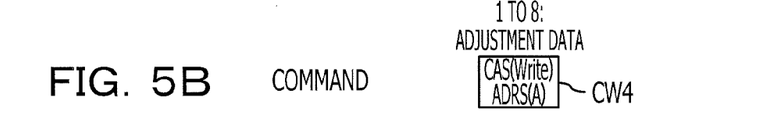
Figure 5C:
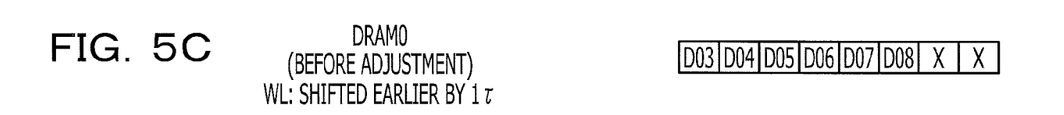
Figure 5D:
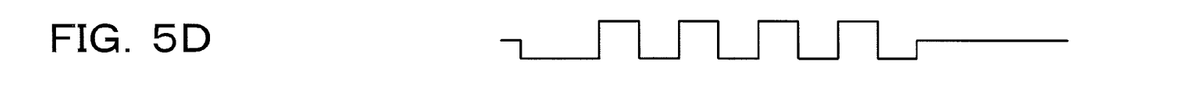
Figure 5E:
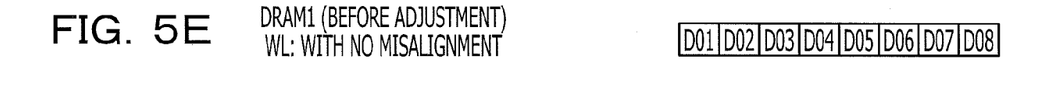
Figure 5F:
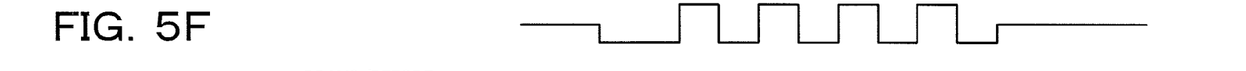
Figure 5G:
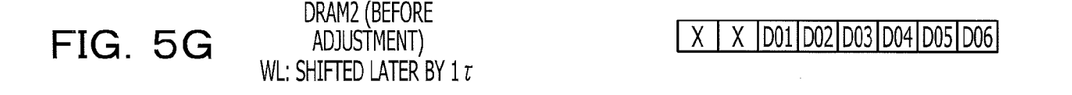
Figure 5H:
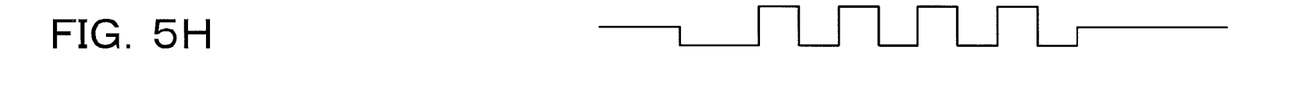

In the timing adjustment of the Write Leveling, the single-shot write function 112 writes the adjustment data DT4 into the DIMM 30. FIG. 5A to FIG. 5H illustrate an exemplary write operation. For example, the write operation illustrated in FIGS. 5A to 5H may be the write operation in the single-shot write mode in the memory system 1 illustrated in FIG. 2. FIG. 5A illustrates the CLK (CLK@DIMM) of the DIMM 30. Each of FIG. 5D, FIG. 5F, and FIG. 5H illustrates the DQS of the DIMM 30. FIG. 5B illustrates a write command CW4 transmitted from the command processing circuit 11. Each of FIG. 5C, FIG. 5E, and FIG. 5G illustrates a write data pattern to be written into the DIMM 30.

In FIG. 5E and FIG. 5F, the DQS in the Write Leveling may correspond to a preferable timing, and the write data pattern is written into the DIMM 30 without the misalignment thereof. In addition, in FIG. 5C and FIG. 5D, the timing of the DQS in the Write Leveling becomes earlier than states illustrated in FIG. 5E and FIG. 5F, and is shifted to a preceding side by 1 τ. In FIG. 5G and FIG. 5H, the timing of the DQS in the Write Leveling becomes later than states illustrated in FIG. 5E and FIG. 5F, and is shifted to a following side by 1 τ.

In the single-shot write function 112, the adjustment data DT4 is written based on the one write command CW4 in FIG. 5B, transmitted to the DIMM 30 by the command processing circuit 11. For example, the adjustment data DT4 is written at the second address B of the DIMM 30 based on the command CW4. For example, in the single-shot write mode, the command processing circuit 11 writes the adjustment data DT4 at the second address B of the DIMM 30.

In the timing adjustment of the Write Leveling, the read data processing circuit 14 reads and processes the write data pattern written into the DIMM 30. When the command processing circuit 11 has repeatedly transmitted a read command CR for reading data from the address B, to the DIMM 30, the read data processor 14 receives and processes data transmitted from the DIMM 30 in response to these read commands.

In the continuous write mode, the read data processing circuit 14 processes the adjustment data DT1 read from the second address B of the DIMM 30, and in the single-shot write mode, the read data processing circuit 14 processes the adjustment data DT4 read from the second address B of the DIMM 30. The read data processor 14 reads the adjustment data DT1 from the second address B of the DIMM 30.

The read data processing circuit 14 corrects the misalignment of cycles in the Write Leveling based on the read data which is read from the address B of the DIMM 30. The read data processing circuit 14 illustrated in FIG. 2 includes a Write Leveling response processing circuit 141 and a read data pattern check circuit 142. The read data pattern check circuit 142 determines a TAP delay amount for adjusting the output timing of the DQS based on the read data which is read from the second address B of the DIMM 30.

Figure 6:
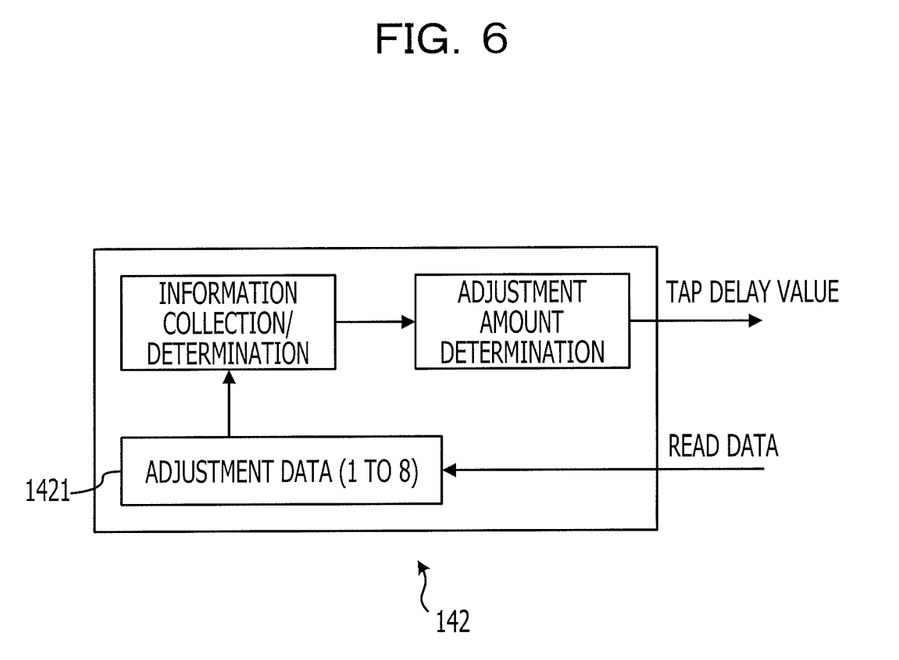
FIG. 6 illustrates an exemplary read data pattern check.

FIG. 6 illustrates an exemplary read data pattern check. The read data pattern check illustrated in FIG. 6 may be performed by the read data pattern check circuit 142 illustrated in FIG. 2. The read data, which is read from the DIMM 30 through the IO macro 20 based on the read command CR, is temporarily stored in a buffer 1421. The read data is stored in the buffer 1421 in a FIFO manner.

Figure 7A:
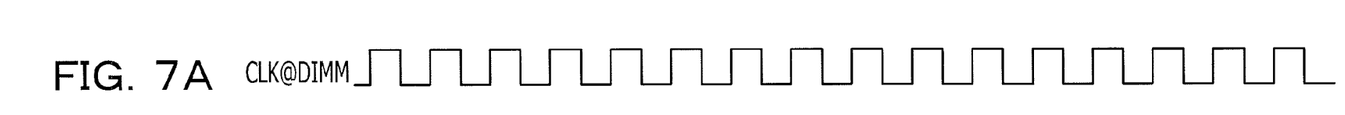
FIG. 7A to FIG. 7E illustrate an exemplary read process.
Figure 7B:
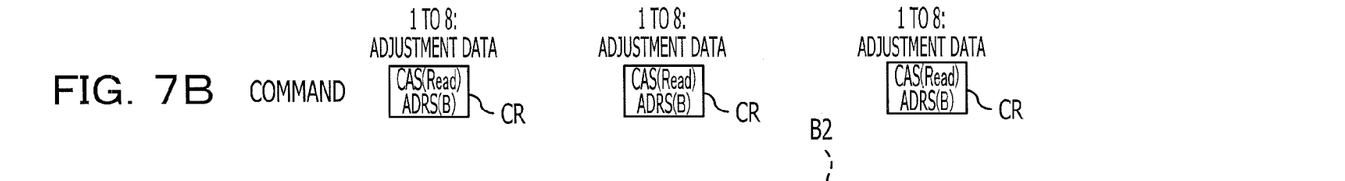
Figure 7C:
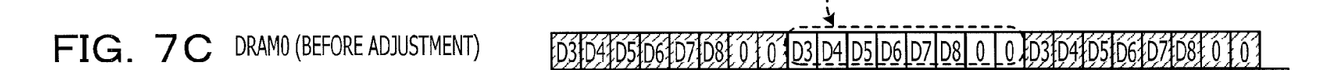
Figure 7D:
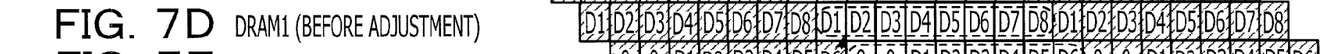
Figure 7E:
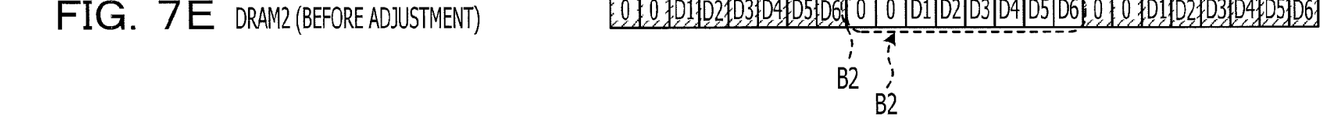

FIG. 7A to FIG. 7E illustrate an exemplary read operation. For example, the read operation illustrated in FIGS. 7A to 7E may be the read operation in the continuous write mode in the memory system 1 illustrated in FIG. 2. FIG. 7A illustrates the CLK (CLK@DIMM) of the DIMM 30. FIG. 7B illustrates the read commands CR transmitted from the command processing circuit 11. Each of FIG. 7C, FIG. 7D, and FIG. 7E illustrates read data which is read from the DIMM 30.

An arrow B2 illustrated in each of FIG. 7C, FIG. 7D, and FIG. 7E illustrates the read data which is read from the second address B of the DIMM 30 in response to one read command CR. In FIG. 7D, the write data pattern stored in the state illustrated in FIG. 4E is read as the read data. For example, the test values D1 to D8 of the adjustment data DT1 are adequately read from the second address B and stored in the buffer 1421.

In FIG. 7C, the write data pattern stored in the state illustrated in FIG. 4C is read. For example, in FIG. 7C, the test values D3 to D8 and the dummy values "0" and "0" are read from the second address B of the DIMM 30 and stored in the buffer 1421. In FIG. 7E, the write data pattern stored in the state illustrated in FIG. 4G is read. For example, in FIG. 7E, the dummy values "0" and "0" and the test values D1 to D6 are read from the second address B of the DIMM 30 and stored in the buffer 1421.

Based on the read data, which is read from the second address B of the DIMM 30 and stored in the buffer 1421, the read data pattern check circuit 142 performs information collection or determination. In the continuous write mode, the read data pattern check circuit 142 confirms the read data of the buffer 1421 in order, from the beginning thereof, for example, from the left sides in FIG. 7C, FIG. 7C, and FIG. 7E. The read data pattern check circuit 142 collects and analyzes information such as a test value initially confirmed in the read data, a test value finally confirmed in the read data, the continuity of a test value, or the like, and stores a result in a memory or the like not illustrated.

The read data pattern check circuit 142 determines whether or not the test value initially confirmed in the read data is the D1. In the determination for the continuity of a test value, when each of the test values D1 to D8 is expressed as a test value Dn (n=a natural number from 1 to 8), it is confirmed whether or not Dk+1 (k: a natural number from 1 to 7) is arranged next to Dk.

The read data pattern check circuit 142 determines the amount of adjustment of the output timing of the DQS in the Write Leveling based on a determination result, and calculates the TAP delay value corresponding to the amount of adjustment. For example, when the test value initially confirmed in the read data is the D1, the read data pattern check circuit 142 adjusts a timing at which write data is output, for example, decreases the delay TAP, for example.

For example, when the test value finally confirmed in the read data is Dn, the number of adjusted cycles (the number of decreased cycles) s may be calculated from the following Expression (1).

$$\text{the number of decreased cycles } s = 8 - n \quad (1)$$

For example, when the test value finally confirmed in the read data is D6, the number of decreased cycles s=8−6=2 may be determined based on the above-mentioned Expression (1).

When the test value initially confirmed in the read data is not the D1, the read data pattern check circuit 142 adjusts a timing at which write data is output, for example, increases the delay TAP. For example, when the test value initially confirmed in the read data is Dn, the number of adjusted cycles (the number of increased cycles) s may be calculated from the following Expression (2).

$$\text{the number of increased cycles } s = n - 1 \quad (2)$$

For example, when the test value initially confirmed in the read data is D3, the number of increased cycles s=3−1=2 may be determined.

Based on the read position of the test values D1 to D8 or the dummy value of the read data which is read from the second address of the DIMM 30, the read data processing circuit 14 determines the number of adjusted cycles s for correcting the misalignment of the adjustment data DT1. The calculation method for the number of adjusted cycles s, performed in the read data pattern check circuit 142, may include Expression (1), Expression (2), another operational expression, or a conversion correspondence rule.

Figure 8A:
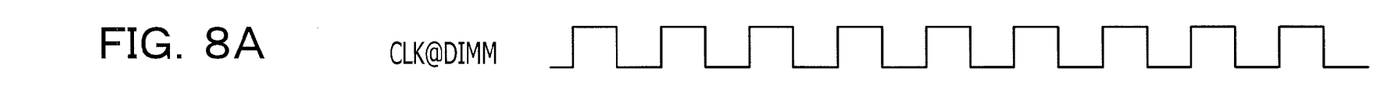
FIG. 8A to FIG. 8E illustrate an exemplary read process.
Figure 8B:
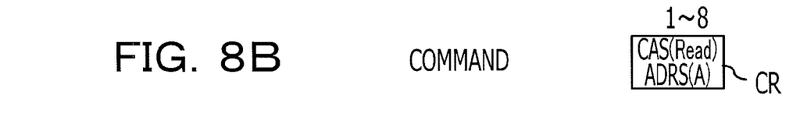
Figure 8C:
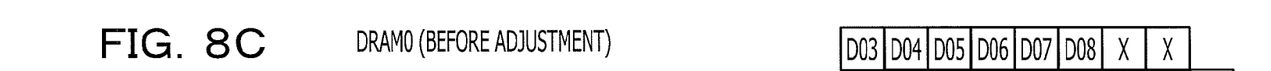
Figure 8D:
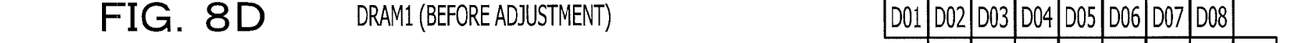
Figure 8E:
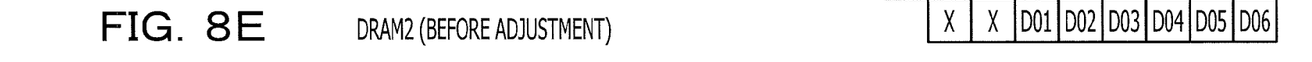

The read data pattern check circuit 142 determines the TAP delay value to be set in the delay TAP 21 based on the determined number of cycles s to be adjusted,. The determination of the TAP delay value may be performed in accordance with the conversion correspondence rule, or may be performed in accordance with another existing method. FIG. 8A to FIG. 8E illustrate an exemplary read operation. For example, the read'operation illustrated in FIG. 8A to FIG. 8E may be the read operation in the single-shot write mode in the memory system 1 illustrated in FIG. 2. FIG. 8A illustrates the CLK (CLK@DIMM) of the DIMM 30. FIG. 8B illustrates the read command CR transmitted from the command processing circuit 11. Each of FIG. 8C, FIG. 8D, and FIG. 8E illustrates read data which is read from the second address B of the DIMM 30.

In FIG. 8D, the write data pattern stored in the state illustrated in FIG. 5E is read as the read data. The test values D01 to D08 of the adjustment data DT4 are adequately read from the second address B and stored in the buffer 1421. In FIG. 8C, the write data pattern stored in the state illustrated in FIG. 5C is read. In FIG. 8C, the test values D03 to D08 and the indefinite values X and X are read from the second address B of the DIMM 30 and stored in the buffer 1421.

In FIG. 8E, the write data pattern stored in the state illustrated in FIG. 5G is read. For example, in FIG. 8E, the indefinite values X and X and the test values D01 to D06 are read from the second address B of the DIMM 30 and stored in the buffer 1421. In the single-shot write mode, for example, the read data pattern check circuit 142 confirms whether or not the read data, read from the second address B of the DIMM 30 and stored in the buffer 1421, is stored in a state illustrated in FIG. 8D. In the memory system 1 illustrated in the FIG. 2, it is confirmed whether or not the Write Leveling is adequately performed.

In the continuous write mode, the Write Leveling response processor 141 adjusts the output timing of the DQS by transmitting the TAP delay value determined by the read data pattern check circuit 142 to the delay TAP 21. Based on a result of reading a test pattern from the second address B of the DIMM 30, the read data processor 14 adjusts the timing of writing data into the DIMM 30.

Figure 9:
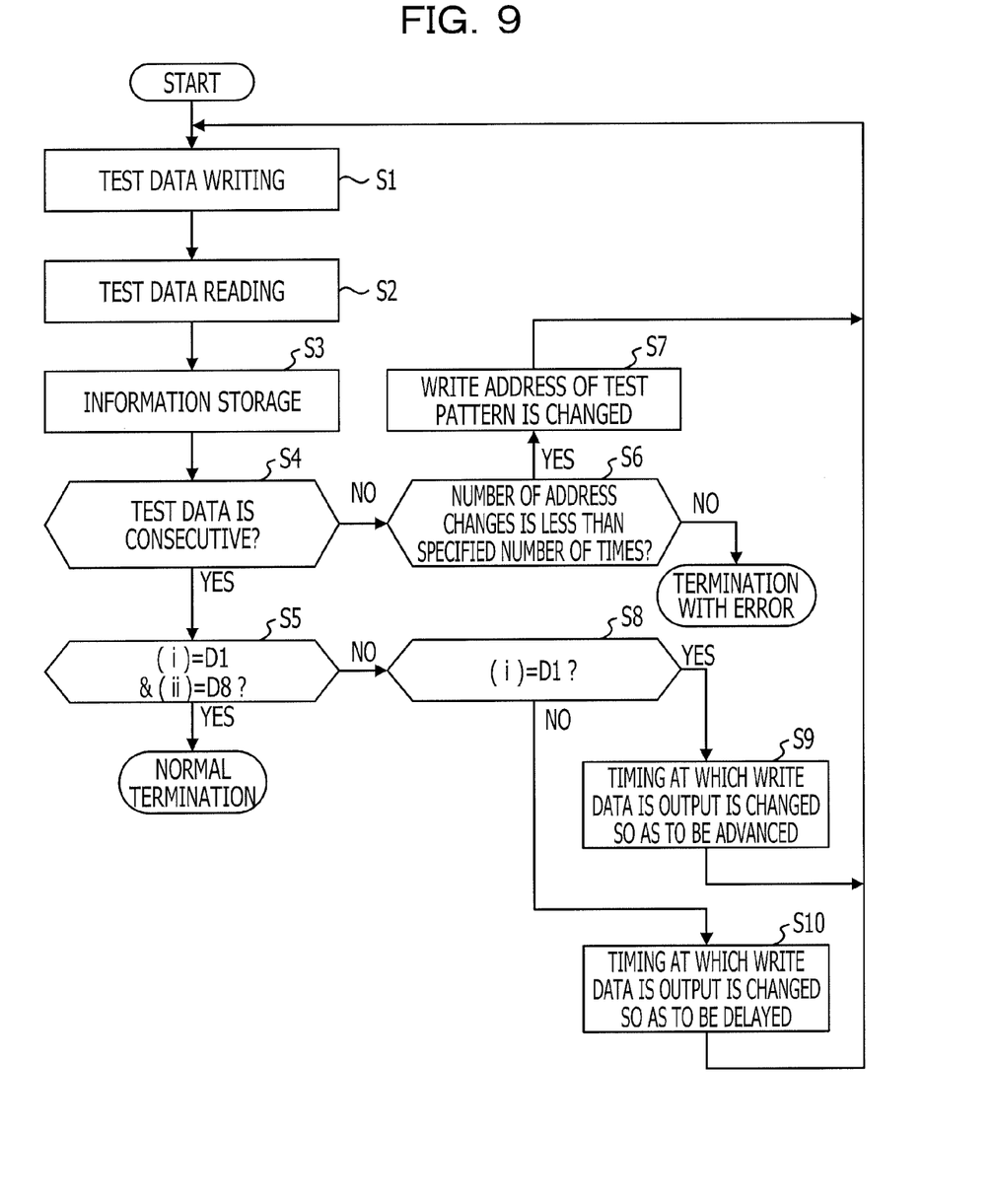
FIG. 9 illustrates an exemplary process of a continuous write mode.

FIG. 9 illustrates an exemplary process in a continuous write mode. The process illustrated in FIG. 9 may be performed in the memory system 1 illustrated in FIG. 2. In an operation S1, the write commands CW1 to CW3 are transmitted from the continuous write function circuit 111 in the command processing circuit 11 to the DIMM 30, and the dummy data DT2, the adjustment data DT1, and the dummy data DT3 are sequentially written at the addresses A, B, and C.

In an operation S2, the command processing circuit 11 transmits the read command CR to the DIMM 30, and reads the adjustment data DT1 stored at the second address B. In an operation S3, the read data processing circuit 14 may collect or analyze information such as a test value initially confirmed in the read data of the buffer 1421, a test value finally confirmed in the read data, the continuity of a test value, or the like, and may store a result in a memory or the like not illustrated.

In an operation S4, the read data processing circuit 14 confirms whether or not test values are consecutive. When the test value are consecutive (the operation S4: YES), in an operation S5, it is confirmed whether the test value initially confirmed in the read data=D1 and the test value finally confirmed in the read data=D8. For example, it is confirmed whether or not the write data pattern illustrated in FIG. 7D has been read as the read data from the second address B.

When it is confirmed that the test value initially confirmed in the read data=D1 and the test value finally confirmed in the read data=D8 (the operation S5: YES), the process is normally terminated. When it is not confirmed that the test value initially confirmed in the read data=D1 and the test value finally confirmed in the read data=D8 (the operation S5: NO), in an operation S8, it is confirmed whether or not the test value initially confirmed in the read data=D1.

When the test value initially confirmed in the read data=D1 (refer to YES route in the Operation S8), in an operation S9, the read data processing circuit 14 adjusts a timing at which write data is output, for example, decreases the delay TAP. The read data processing circuit 14 calculates the number of decreased cycles s based on Expression (1). The read data pattern check circuit 142 determines the TAP delay value of the delay TAP 21 based on the calculated number of cycles s, sets the determined TAP delay value in the delay TAP 21, and the process returns to the operation 51.

When the test value initially confirmed in the read data=D1 is not satisfied (the operation S8: NO), in an operation S10, the read data processing circuit 14 adjusts a timing (delay TAP) at which write data is output so as to delay the timing. The read data processing circuit 14 calculates the number of decreased cycles s based on Expression (2). The read data pattern check circuit 142 determines the TAP delay value to be set in the delay TAP 21 based on the calculated number of cycles s, sets the determined TAP delay value in the delay TAP 21, and the process returns to the operation 51.

When, in the operation S4, the test values are not consecutive (the operation S4: NO), in the operation S6, the read data processing circuit 14 confirms whether or not the number of times the second address B has been changed (the number of address changes) less than the specified number of times. When the number of address changes is not less than the specified number of times (the operation S6: NO), the process is terminated with an error. In the memory system 1, when the delay TAP 21 overflows or underflows, the process is terminated with an error.

When the number of address changes is less than the specified number of times (the operation S6: YES), the read data processing circuit 14 changes the second address B in an operation S7, and the process returns to the operation S1. In the operation S4, when the test values are not consecutive, the second address B that is the write destination of the adjustment data DT1 is changed, and a retry is performed. The timing adjustment of the Write Leveling is performed, and hence, reliability may be improved.

In the single-shot write mode, the command processing circuit 11 transmits the write command CW4 to the DIMM 30, and the adjustment data DT4 is written at the second address B of the DIMM 30. The command processing circuit 11 transmits the read command CR to the DIMM 30, and the adjustment data DT1 stored at the second address B is read.

The read data processing circuit 14 confirms whether or not the read data, which is read from the second address B of the DIMM 30 and stored in the buffer 1421, is stored in the state illustrated in FIG. 8D. In the present memory system 1, it is confirmed whether or not the Write Leveling is performed with adequate timing. The load on the memory controller 10 in the process in the single-shot write mode may be smaller than that in the process in the continuous write mode. For example, the timing adjustment of the Write Leveling, executed in the continuous write mode or the like, may be confirmed in the single-shot write mode.

In the continuous write mode of the memory system 1 illustrated in FIG. 2, based on the read position of the test values D1 to D8 or dummy value of the read data which is read from the second address of the DIMM 30, the number of adjusted cycles s for correcting the misalignment of the adjustment data DT1 is determined. In the Write Leveling, the DQS may be caused to coincide with the edge of a correct CLK in a write command based on the detected misalignment of cycles with respect to the write command, and the misalignment of cycles in the Write Leveling may be easily corrected. A TAP delay value appropriate for the delay TAP 21 may be set without the calculation of the initial value of the delay TAP.

Since the read data processing circuit 14 calculates and sets the TAP delay value in the delay TAP 21, the timing adjustment of the DQS may be autonomously performed. In the continuous write mode, an indefinite value may not be stored at the second address B of the DIMM 30 of an investigation target. Since the delay TAP 21 used in the Write Leveling of the IO macro 20 in a DDI is used, function addition may not be performed on an IO macro 20 side. The handling of a general-purpose DDR interface such as DFI may not be performed.

The continuous write mode and the single-shot write mode may be selectively set. When the timing of the Write Leveling is confirmed, the process in the single-shot write mode may be performed. Therefore, the load of the memory controller 10 may be reduced.

The memory controller 10 and the IO macro 20 may be provided separately from each other and the memory controller 10 may include the function of the IO macro 20. The numbers of bits of the adjustment data DT1, the adjustment data DT4, the dummy data DT2, and the dummy data DT3 may be any numbers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A memory controller comprising:
a first write circuit configured to write a first dummy pattern including a plurality of consecutive first dummy values at a first address of a memory;
a second write circuit configured to write a first pattern including a plurality of types of consecutive values at a second address of the memory after a write operation of the first dummy pattern by the first write circuit;
a third write circuit configured to write a second dummy pattern including a plurality of consecutive second dummy values at a third address of the memory after a write operation of the first pattern by the second write circuit;
a read circuit configured to read the written first pattern based on the second address of the memory; and
a timing adjustment circuit configured to adjust a timing at which data is written into the memory based on a read first pattern.

2. The memory controller according to claim 1, wherein the timing adjustment circuit adjusts the timing at which data is written into the memory based on a start of a read operation of the written first pattern by the read circuit.

3. The memory controller according to claim 1, wherein the timing adjustment circuit determines an amount of change in the timing at which data is written into the memory based on a start or an end of a read operation of the written first pattern by the read circuit.

4. The memory controller according to claim 1, further comprising:
a fourth write circuit configured to write a second pattern including a plurality of types of consecutive values at the second address of the memory.

5. The memory controller according to claim 4, wherein one of a continuous write operation and a single-shot operation is performed selectively, a write operation of the first dummy pattern by the first write circuit, a write operation of the first pattern by the second write circuit and a write operation of the second dummy pattern by the third write circuit being continuously performed respectively in the continuous write operation, a write operation of the second pattern by the fourth write circuit being performed in the single-shot operation.

6. The memory controller according to claim 1, wherein the number of bits of the first dummy pattern and the number of bits of the first dummy pattern are equal to each other.

7. A control method for a memory, the control method comprising:
    writing a first dummy pattern including a plurality of consecutive dummy values at a first address of the memory;
    writing a first pattern including a plurality of types of consecutive values at a second address of the memory after the writing of the first dummy pattern, the first pattern being different from the first dummy pattern;
    writing a second dummy pattern including a plurality of consecutive dummy values at a third address of the memory after the writing of the first pattern;
    reading the written first pattern based on the second address of the memory; and
    adjusting a timing at which data is written into the memory based on the read first pattern.

8. The control method according to claim 7, wherein adjusting the timing at which data is written into the memory based on a start of the reading of the written first pattern.

9. The control method according to claim 7, wherein determining an amount of change in the timing at which data is written into the memory based on a start or an end of the reading of the written first pattern.

10. The control method according to claim 7, further comprising:
    writing a second pattern including a plurality of types of consecutive values at the second address of the memory.

11. The control method according to claim 7, further comprising:
    performing selectively one of a continuous write operation and a single-shot operation, the writing of the first dummy pattern, the writing of the first pattern and the writing of the second dummy pattern being continuously performed respectively in the continuous write operation, a write operation of the second pattern by the fourth write circuit being performed in the single-shot operation.

* * * * *